United States Patent [19]
Miller et al.

[11] Patent Number: 5,431,968
[45] Date of Patent: Jul. 11, 1995

[54] METHOD FOR SIMULTANEOUSLY COATING A PLURALITY OF FILAMENTS

[76] Inventors: Paul A. Miller, 1004 Matia Ct. NE., Albuquerque, N. Mex. 87123; Paul D. Pochan, 3308 Morris St. NE., #11, Albuquerque, N. Mex. 87111; Michael P. Siegal, 9900 Spain NE., Apt. W-2123, Albuquerque, N. Mex. 87111; Frank Dominguez, 11341 Academy Ridge Rd. NE., Albuquerque, N. Mex. 87111

[21] Appl. No.: 217,229

[22] Filed: Mar. 24, 1994

Related U.S. Application Data

[63] Continuation-in-part of Ser. No. 163,213, Dec. 7, 1993, abandoned.

[51] Int. Cl.6 .............................................. B05D 3/06
[52] U.S. Cl. .................................... 427/577; 427/569
[58] Field of Search ............................... 427/569, 577

[56] References Cited

U.S. PATENT DOCUMENTS

| | | | |
|---|---|---|---|
| 4,368,092 | 1/1983 | Steinberg et al. | 156/345 |
| 4,402,993 | 9/1983 | Aisenberg et al. | 427/38 |
| 4,530,750 | 7/1985 | Aisenberg et al. | 204/298 |
| 4,742,012 | 5/1988 | Matsumura | 427/569 X |
| 4,918,031 | 4/1990 | Flamm et al. | 437/225 |

OTHER PUBLICATIONS

Cook, J. M., et al, "Application of a Low-Pressure Radio Frequency Discharge Source to Polysilicon Gate Etching," *J. Vacuum Science Technology*, B8(1), pp. 1–4 (1990). (No month available).

Rudder, R. A., et al, "Direct Deposition of Polycrystalline Diamond Films on Si(100) Without Surface Pretreatment," *Applied Physics Letters*, vol. 59, pp. 791–793 (1991). (No month available).

Hsu, W., "Diamond Coatings," *Advanced Manufacturing Technologies, Sandia Technology*, pp. 10–11 (Mar. 1993).

Advertisement Prototech Research, Inc., the ES-RF Resonator Plasma Source (4 sheets) (No date avail.).

*Primary Examiner*—Bernard Pianalto
*Attorney, Agent, or Firm*—Timothy D. Stanley; George H. Libman

[57] ABSTRACT

Methods and apparatuses for coating materials, and the products and compositions produced thereby. Substances, such as diamond or diamond-like carbon, are deposited onto materials, such as a filament or a plurality of filaments simultaneously, using one or more cylindrical, inductively coupled, resonator plasma reactors.

14 Claims, 2 Drawing Sheets

METHOD FOR SIMULTANEOUSLY COATING A PLURALITY OF FILAMENTS

The U.S. Government has rights to this invention pursuant to Contract No. DE-AC04-76DP00789 awarded by the U.S. Department of Energy.

This is a continuation-in-part of application Ser. No. 08/163,213 filed on Dec. 7, 1993, abandoned.

BACKGROUND OF THE INVENTION

1. Field of the Invention (Technical Field)

The present invention relates to methods and apparatuses for coating materials, and the products and compositions produced thereby, including filaments coated with diamond (D) and diamond-like carbon (DLC).

2. Background Art

The present invention permits the making of advanced composites by the deposition of diamond (D) and/or diamond-like carbon (DLC) on the surface of filaments of materials such as graphite and Kevlar. The D/DLC coating gives enhanced properties to the filaments and to composites formed from the filaments. Enhanced properties include improved compressive strength and improved thermal conductivity.

The deposition of D/DLC from plasmas containing carbon and hydrogen (e.g., $H_2+CH_4$) onto flat surfaces is well known. Enhanced properties are known to result when the plasma bombards the workpiece with high-energy (e.g., 200 ev) ions during DLC deposition. DLC depositions are usually performed at low pressures (less than 0.1 Torr) to enhance ion bombardment. In contrast, D deposition is usually performed at higher pressures (many Torr) without ion bombardment, either using microwaves or radio-frequency power. Rudder et al, "Direct Deposition of Polycrystalline Diamond Films on Si(100) Without Surface Pretreatment," *Appl. Phys. Letters* 59:791 (1991).

What has not heretofore been known is the manufacture of composites fabricated from filaments coated uniformly with D/DLC. To be economical, the deposition should take place rapidly in a continuous-flow reactor that processes many filaments simultaneously. Filaments are fragile and normally are not handled individually, but are produced in bundles called tows consisting of 1,000 to 10,000 filaments. To achieve deposition on all sides of the filaments in a tow, the filaments must be spread apart during the deposition. The deposition rate of DLC is fast compared to D, but the economical production of DLC-coated tows still requires optimization of a production line with regard to deposition rate.

U.S. Pat. No. 4,402,993, entitled "Process for Coating Optical Fibers," to Aisenberg, et al., discloses the deposition of a diamond-like carbon film onto a single optical fiber. The purpose of the thin carbon film in the patent is to enable further deposition of a hermetically-sealed coating to protect optical fibers from contact with the atmosphere, not to apply a thicker carbon layer to achieve enhanced strength and thermal conductivity of structural filaments to be used to form composite structures.

U.S. Pat. No. 4,530,750, entitled "Apparatus for Coating Optical Fibers," to Aisenberg, et al., is substantially identical to the '993 patent.

U.S. Pat. No. 4,918,031, entitled "Processes Depending on Plasma Generation Using a Helical Resonator", to Flamm, et al., describes the use of helical resonators to generate plasmas for processing of semiconductor devices. The authors cite previous use of helical resonators for isotropic semiconductor etching pressures above 0.1 Torr. Flamm, et al., is restricted to semiconductor processing or related applications such as making multi-layer dielectric mirrors.

SUMMARY OF THE INVENTION (DISCLOSURE OF THE INVENTION)

The present invention is of an apparatus and method for coating a substrate with a substance (and of a product produced thereby), comprising: providing a plurality of plasma reactors connected in series; generating a plasma comprising the substance within the plasma reactors; and passing the substrate through the series of plasma reactors so that the substance is deposited onto the substrate. In the preferred embodiment, diamond or diamond-like carbon is the substance deposited. Preferably a plurality of cylindrical, inductively-coupled plasma reactors connected in series are used, and most preferably a plurality of helical-resonator plasma reactors connected in series. The reactors may be powered by a single continuous coil. In the preferred embodiment, a filament, a plurality of filaments, or a tow of filaments is passed through the series of plasma reactors so that the substance is deposited onto each filament. If desirable, the substrate is first cleaned in a reactor in series with the plasma reactors, a coating is deposited onto the substrate to enhance deposition of the substance onto the substrate, and the substrate is biased to enhance deposition of the substance onto the substrate. Alternatively, a coating can be deposited onto the substrate to protect the substrate from possible degradation due to interactions with the plasma environment in the D/DLC deposition reactor, which contains energy particles and protons. Furthermore, a protective coating may be deposited onto the substance by reactor in series with the plasma reactors. If needed, reduction of deposition of the substance onto walls of the plasma reactors may be provided, such as by use of static magnetic fields in a multipole cusp arrangement.

The present invention is also of a method for coating a plurality of filaments simultaneously (and the product produced thereby) comprising: providing a cylindrical plasma reactor; providing means for spreading the filaments out from one another so that each of the filaments is coated evenly when passed through the plasma reactor; generating a plasma comprising a substance within the plasma reactors; and passing the filaments simultaneously through the plasma reactor so that the substance is deposited onto the filaments. In the preferred embodiment, a tow is passed through the plasma reactor such that the substance (preferably diamond or diamond-like carbon) is deposited onto each filament of the tow. The plasma reactor is preferably an inductively coupled, helical-resonator plasma reactor. If desirable, a layer of metal may be deposited onto the filaments prior to deposition of the substance, and the filaments may be electrically biased to improve deposition.

The present invention is additionally of a method for coating a filament with a substance (and the product produced thereby) comprising: providing an inductively coupled plasma reactor; generating a plasma comprising the substance within the plasma reactor; and passing the filament through the plasma reactor so that the substance is deposited onto the filament. In the preferred embodiment, a plurality of filaments (or a tow of filaments) are passed simultaneously through the plasma reactor so that the substance is deposited onto the filaments, and the substance deposited is diamond or diamond-like carbon. If desirable, a layer of metal may be deposited onto the filaments prior to deposition of the substance, and the filaments may be electrically biased to improve deposition.

The present invention is also of a method of depositing diamond or diamond-like carbon onto a non-conductive, temperature sensitive substrate (and the product produced thereby) comprising: coating the substrate with a conductive material; electrically biasing the coated substrate; and depositing diamond or diamond-like carbon onto the coated substrate by plasma reactor.

A primary object of the present invention is to deposit D/DLC onto filaments to enhance strength and thermal conductivity of the filaments.

An additional object of the present invention is to enhance the compressive and tensile strength of fibers used to manufacture composite materials, such as Kevlar fibers, which are known to have limited compressive strength.

Another object of the present invention is to provide an apparatus comprising a plurality of plasma sources in series being useful for a wide variety of deposition needs.

A primary advantage of the present invention is that a plurality of filaments, even thousands at a time, may be coated simultaneously with a desired substance.

Another advantage of the present invention is that it permits convenient scaling of applications by simply altering the number of reactors in series.

An additional advantage of the present invention is that it is capable of operating over wide ranges of temperatures and pressures.

Other objects, advantages and novel features, and further scope of applicability of the present invention will be set forth in part in the detailed description to follow, taken in conjunction with the accompanying drawings, will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings:

FIG. 2B is a cross-section of an electrode of FIG. 2A.

DESCRIPTION OF THE PREFERRED EMBODIMENTS (BEST MODES FOR CARRYING OUT THE INVENTION)

The present invention relates to methods and apparatuses for coating materials, and the products and compositions produced thereby, including filaments coated with diamond (D) and diamond-like carbon (DLC). Any other material that can be coated by plasma techniques may be deposited according to the invention, such as silicon-carbide.

The preferred technique of the present invention is to use multiple series stages of a cylindrical plasma reactor of a type known as a "helical-resonator reactor" to generate plasma and accomplish the deposition. That reactor type is known for its application in the semiconductor industry (e.g., U.S. Pat. No. 4,368,092, entitled "Apparatus for the Etching for Semiconductor Devices," to Steinberg, et al.). In that application, the cylindrical shape of the reactor is a disadvantage because of its bulkiness. Also, in come cases, the reactor must be operated with electrostatic shields to minimize the flux of particulates and of high-energy ions onto the flat workpiece (wafer).

Figure 1:
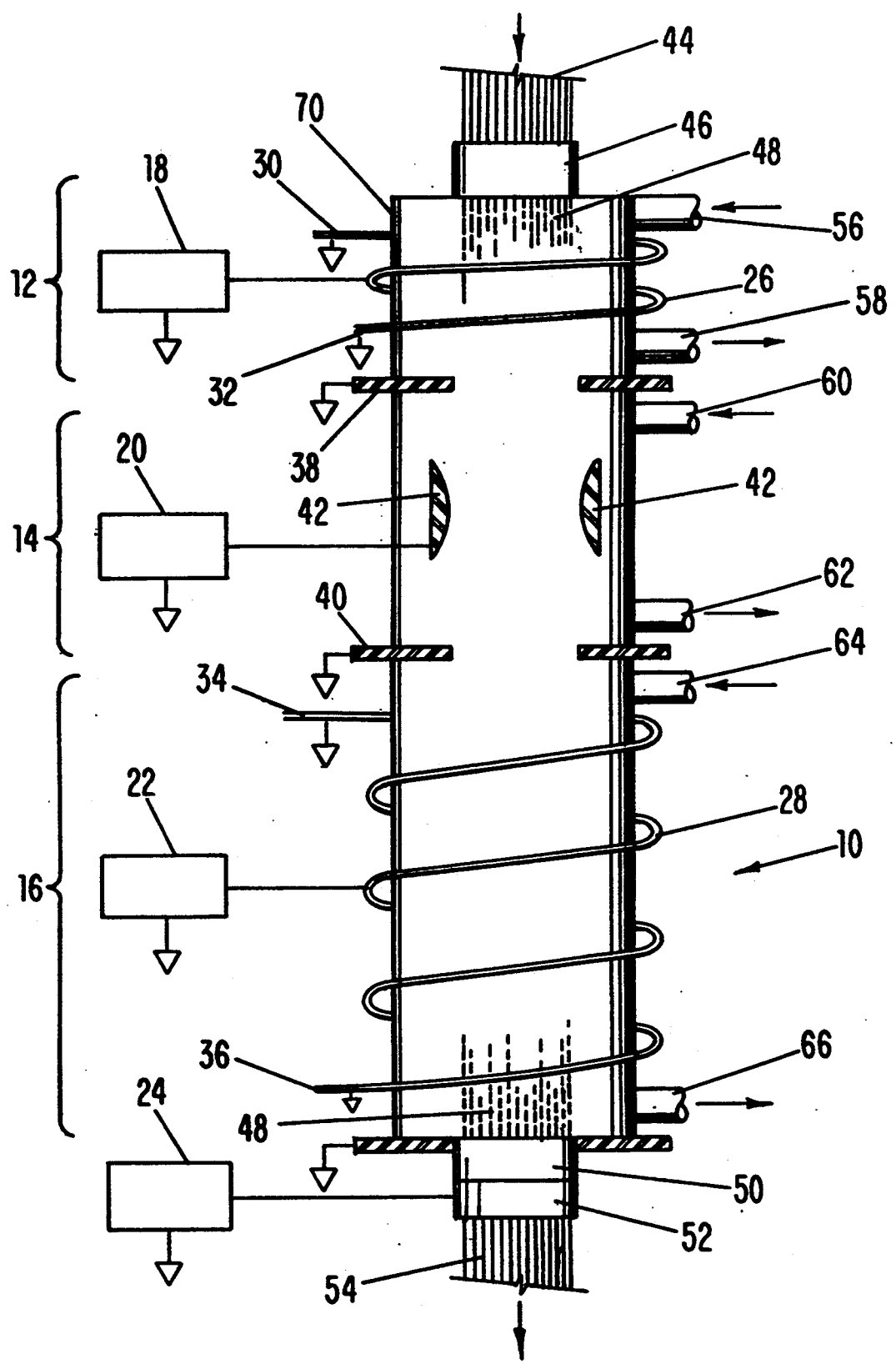
FIG. 1 is a diagram of the preferred apparatus of the invention.

FIG. 1 presents the preferred apparatus of the invention 10. For DLC deposition, the apparatus preferably has at least three main sections: cleaning section 12, metal-coating section 14, and DLC deposition section 16. For D deposition, metal-coating section 14 may be eliminated and a D deposition section 16 substituted for the DLC deposition section. For coating with a substance other than D/DLC, deposition section 16 would deposit such other substance. Each section includes a cylindrical, electrically insulating vacuum chamber 70. In operation, a continuous feed of uncoated tows 44 proceeds into fiber spreading unit 46 (which may be mechanical and/or electrostatic spreading devices), which causes monofilaments 48 to enter cleaning section 12. Monofilaments 48 proceed through the three sections of apparatus 10, through insulator 50 and tow forming unit 52, which forms monofilaments 48, now coated, into a continuous output of coated tows 54. A negative bias to control ion energy for DLC formation from, e.g., methane, may be supplied to monofilaments 48 by bias supply 24, which may provide alternating current and/or direct current.

Cleaning section 12 includes helical radio frequency (rf) coil 26 powered by rf power supply 18. Cooling water is supplied by intake 30 and extracted by outtake 32. A cleaning gas, such as argon, oxygen, or hydrogen, is supplied by cleaning gas input 56, and extracted by vacuum pump 58.

Metal-coating section 14 is optional. Alternatively, conductive material or non-conductive material (e.g., carbides, nitrides, oxides) can be deposited onto the substrate in the coating Section 14 to prevent the substrate from degradation due to interactions of the substrate with the plasma environment in the D/DLC Section 16. It is used to allow biasing of non-conducting filaments 48 by power supply 24 while those filaments are in deposition section 16. This biasing may be desirable to increase ion energies above the level present in the plasma in deposition section 16. Metal-coating section 14 includes sputtering cathodes 42 made of a conductor to be coated on monofilaments 48, such as copper or aluminum, which cathodes are powered by sputtering power supply 20. An rf coil and an rf power supply for this section are optional. A sputtering gas, such as argon, is supplied by sputtering gas input 60, and extracted by vacuum pump 62.

DLC deposition section 16 includes helical rf coil 28 powered by rf power supply 22. Cooling water is supplied by intake 34 and extracted by outtake 36. A coating gas, such as methane, is supplied by coating gas input 64, and extracted by vacuum pump 66.

If desired, deposition section 16 may be formed of a plurality of discrete deposition sections. Furthermore, a final protective coating section (not shown) may be employed, as discussed below. Sections are separated from one another by grounded electrodes 38 and 40, which also serve as differential-pumping baffles.

While the three sections of the apparatus 10 perform different functions with different gases, all three can operate at the same pressure (less than 0.1 Torr for DLC deposition; many Torr for D deposition). Some mixing of the gases will not present a problem to the proper operation of any section. Consequently, the grounded electrodes/baffles 38 and 40 between sections can successfully allow for differential pumping of the different sections without fitting excessively tightly around monofilaments 48. Note that monofilaments 48 may be configured side by side in a linear configuration or in a circular configuration. Baffles 38 and 40 will are, accordingly, designed to conform to the configuration of monofilaments 48.

Figure 2A:
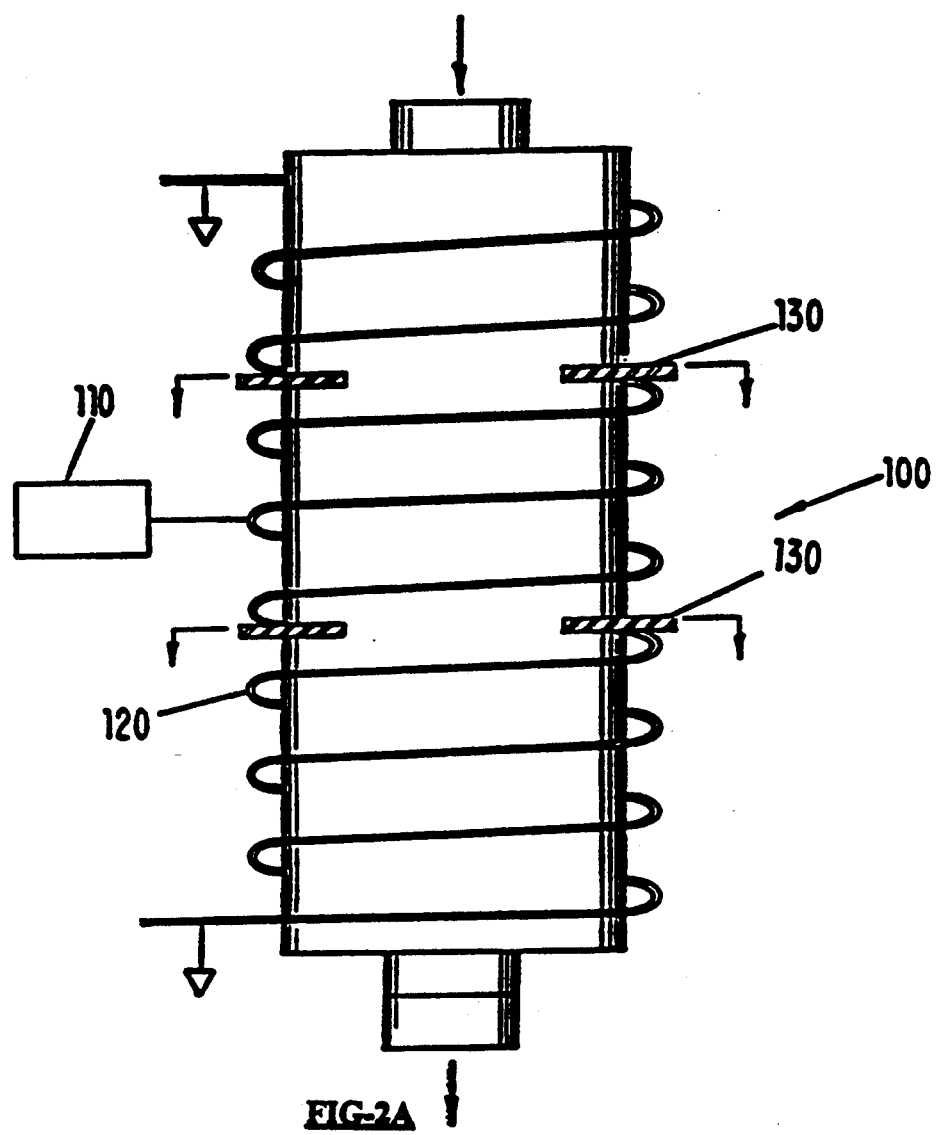
FIGS. 2A and 2B are two views of a diagram of an alternative embodiment of the apparatus of the invention.
Figure 2B:
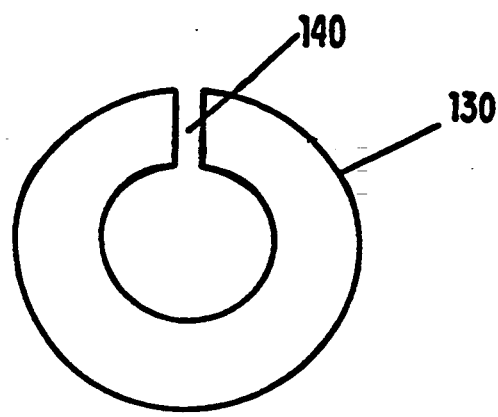

FIGS. 2A and 2B illustrates an alternative embodiment in which a single helical rf coil 120 and rf power supply 110 are utilized for all sections of the apparatus 100. Grounded electrodes 130 separating the sections preferably include insulating breaks 140 to prevent shorting out of the rf fields. The insulating breaks 140 are preferably oriented radially to prevent the flow of azimuthal currents which tend to shield the rf fields out of the nearby reactor sections. Rf coil 120 is electrically insulated from electrodes/baffles 130.

In the present invention, the cylindrical geometry of the helical resonator is an advantage for coating long cylindrical objects (filaments, or groups of filaments known as "tows") because they can be continuously fed into one end of the reactor and out the other end. This feature of helical resonators has not been used to advantage previously.

The cylindrical geometry is further advantageous because it allows convenient scaling to longer and longer systems by placing cylindrical reactor segments end to end. The segments can be arranged vertically in multi-meter lengths with one or more tows suspended parallel to the axis of the system and transported through the reactor. The reactor segments can be separate helical resonators or one long, continuous coil that is powered in parallel at many taps, separated by, for example, $\lambda/2$ at the operating frequency. Alternatively, the frequency of operation could be lowered so that individual reactor segments are very long. Long reactors allow longer residence times of tows, if required, while maintaining high throughput (high tow speed). Separate segments of the reactor may be operated with different gases and at somewhat different pressures if baffles and differential pumping are employed.

Helical-resonator reactors are also advantageous because they can be configured to minimize interaction of the plasma with the reactor walls. This will minimize both material deposition on the walls and erosion of the walls. Plasma-wall deposition can be controlled by the use of electrostatic shields between the coil and plasma (Prototech Research Inc., pamphlet, "ES-RF Resonator Plasma Source," Tempe, Ariz.), by use of limiters (as in tokamaks), and/or by use of static magnetic fields (e.g., 50 Gauss or 0.005 Tesla in amplitude, in a multipole cusp arrangement). Removal of deposits may be accomplished periodically by mechanical means (e.g., scrubbing) or by chemical means (e.g., introduction of oxygen into the discharges).

Helical-resonator reactors are further advantageous because they do not have the main powered electrodes in contact with the plasma. Electrodes are subject to deposition and erosion, and can generate undesirable impurities that degrade the properties of D/DLC.

Helical-resonator reactors operate successfully over a wide range of pressure. When operated at low pressures they can achieve high fractional ionization and high electron temperatures. Consequently, the plasma sheath which will develop around tows (which may be poor conductors) in the plasma will have a potential drop that may be high enough to provide the flux of high-energy ions onto the tow that is desirable for DLC deposition.

D/DLC deposition works better in instances if the filaments are subject to plasma treatment (cleaning) prior to deposition. The geometry of helical resonators is natural for having an initial cleaning section at the input of the reactor followed immediately by deposition sections.

D/DLC deposition also works better on certain filaments, such as Kevlar, if a layer of metal is first deposited onto the filaments, preferably by sputter deposition. This may have advantages both for filaments to which D/DLC does not adhere well and to non-conductive filaments.

D/DLC deposition may also be enhanced by electrical biasing of the filaments to better attract ionized carbon. If the filaments are not conductive, this provides an additional advantage to pre-coating the filaments with metal by sputter deposition, or other method.

DLC may need to be covered by a layer of another material for protection from attack by other components of a composite or to promote adhesion of resin in the composite. The continuous-flow geometry of the proposed helical-resonator system lends itself to having a final deposition section that applies a protective layer to the filaments before they are bundled back together. This final section may be similar to section 14 or 16.

Helical resonators are normally powered by rf power supplies. Such power sources are safer (reduced possibility of radiation leakage) and less expensive than some alternatives, such as microwave sources, and thus are advantageous for industrial applications. The rf power supplies preferably include impedance-matching networks. The helical rf coils are preferably located outside the vacuum chamber, which must consequently be electrically insulating to allow penetration by electrical fields generated by the helical rf coils. Alternatively, the helical rf coils may be placed inside the vacuum chamber.

The general apparatus and technique for coating filaments and tows described herein is valuable for any other plasma-processing application involving long thin workpieces. An example would be treating the surface of optical fibers to modify their properties.

The apparatus and technique in this disclosure can be applied wherever people have need for stronger, lighter structural materials (composites). If the composites are expensive, the market for such composites might be limited to high-value items like airplanes, rockets, and bullet-proof vests. If the composites are inexpensive, consumer items such as automobiles will benefit. Obviously, weight-saving composites improve fuel efficiency. Composites having good thermal conductivity can replace metal radiators in automobiles, again cutting weight.

Industrial Applicability

The invention is further illustrated by the following non-limiting examples.

A prototype cylindrical inductively-coupled plasma reactor for the chemical vapor deposition of DLC from a methane feed gas was constructed. DLC material was grown successfully on graphite filament tows (yarns).

The system was first used to grow DLC by chemical vapor deposition directly from a methane feed gas onto stainless-steel washers. A broad window of processing conditions was found, ranging from rf powers of 25-75 Watts at ambients between 10-40 mTorr pure methane. As pressure was increased, one could go to even lower rf processing powers. The use of rf powers below or above the windows led to the formation of a highly-graphitic glassy carbon state. The transition to glassy carbon at the higher rf powers was hypothesized to result from resistively heating the metal washers to relatively high temperatures (>300° C.) by inducing currents due to the presence of the rf field.

Studies involving growth on graphite filaments followed. A matrix of processing conditions was performed. Methane pressures of 10, 20, 40, and 80 mTorr were each used with 25, 50, 75, 100, and 125 W. rf power. Table 1 summarizes the findings. GC stands for glassy or amorphous carbon with graphitic-like $sp^2$ bonding. It is well-known that DLC (an amorphous mixture of graphitic and diamond, $sp^3$, bonding) degrades into this phase at temperatures above approximately 350° C., followed by degradation into pure graphite at even higher temperatures. Glassy carbon can also result by not providing enough energy to create $sp^3$ bonds at all. In general, the resulting films become diamond-like in properties such as mechanical strength with higher ratios of $sp^3$-to-$sp^2$ carbon-carbon bonds.

TABLE 1

| Methane Pressure (mTorr) | RF Power (Watts) | | | | | |
|---|---|---|---|---|---|---|
| | 25 | 50 | 75 | 100 | 125 | 150 |
| 10 | GC | GC | GC | DLC | DLC | GC |
| 20 | GC | GC/DLC | — | — | — | — |
| 40 | GC/DLC | DLC | GC/DLC | GC | GC | — |
| 80 | DLC | DLC | DLC | GC/DLC | GC/DLC | — |

As one increases the methane pressure, the window for growing DLC broadens in terms of rf power. Furthermore, lower rf power can be used with higher methane pressures.

The preceding examples can be repeated with similar success by substituting the generically or specifically described reactants and/or operating conditions of this invention for those used in the preceding examples.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above, are hereby incorporated by reference.

What is claimed is:

1. A method for coating a plurality of filaments simultaneously, the method comprising the steps of:
   a) providing a cylindrical plasma reactor;
   b) providing means for spreading the filaments out from one another so that each of the filaments is coated evenly when passed through the plasma reactor;
   c) generating a plasma comprising a substance within the plasma reactor; and
   d) passing the filaments simultaneously through the plasma reactor so that the substance is deposited onto the filaments.

2. The method of claim 1 wherein the step of providing a plasma reactor comprises providing a helical-resonator plasma reactor.

3. The method of claim 1 wherein the step of providing a plasma reactor comprises providing an inductively coupled plasma reactor.

4. The method of claim 1 wherein the passing step comprises passing a tow through the plasma reactor so that the substance is deposited onto each filament comprising the tow.

5. The method of claim 1 wherein the passing step comprises passing the filaments through the plasma reactor so that diamond or diamond-like carbon is deposited onto the filaments.

6. The method of claim 1 additionally comprising the step of depositing a layer of metal onto the filaments prior to the passing step.

7. The method of claim 1 additionally comprising the step of electrically biasing the filaments prior to the passing step.

8. A method for coating at least one filament with a substance, the method comprising the steps of:
   a) providing an inductively coupled plasma reactor;
   b) generating a plasma comprising the substance within the plasma reactor; and
   c) passing each filament through the plasma reactor so that the substance is deposited onto each filament.

9. The method of claim 8 wherein the passing step comprises passing a plurality of filaments simultaneously through the plasma reactor so that the substance is deposited onto the filaments.

10. The method of claim 9 wherein a series of inductively coupled plasma reactors are provided, and the passing step comprises passing a tow through the series of plasma reactors so that the substance is deposited onto each filament comprising the tow.

11. The method of claim 8 wherein the passing step comprises passing the filament through the series of plasma reactors so that diamond or diamond-like carbon is deposited onto the filament.

12. The method of claim 8 additionally comprising the step of depositing a layer of metal onto the filament prior to the passing step.

13. The method of claim 8 additionally comprising the step of electrically biasing the filament prior to the passing step.

14. A method of depositing diamond or diamond-like carbon onto a non-conductive, temperature sensitive substrate, the method comprising the steps of:
   a) coating the substrate with a conductive material;
   b) electrically biasing the coated substrate; and
   c) depositing diamond or diamond-like carbon onto the coated substrate by plasma reactor.

* * * * *